US012749661B2

(12) United States Patent
Hong et al.

(10) Patent No.: US 12,749,661 B2
(45) Date of Patent: Sep. 29, 2026

(54) IN-SITU BACK SIDE PLASMA TREATMENT FOR RESIDUE REMOVAL FROM SUBSTRATES

(71) Applicant: LAM RESEARCH CORPORATION, Fremont, CA (US)

(72) Inventors: Tu Hong, Tualatin, OR (US); Chezheng Cao, Beaverton, OR (US); Chunhai Ji, Portland, OR (US); Ming Li, West Linn, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 161 days.

(21) Appl. No.: 18/693,686

(22) PCT Filed: Sep. 15, 2022

(86) PCT No.: PCT/US2022/043635
§ 371 (c)(1),
(2) Date: Mar. 20, 2024

(87) PCT Pub. No.: WO2023/049013
PCT Pub. Date: Mar. 30, 2023

(65) Prior Publication Data

US 2025/0140530 A1 May 1, 2025

Related U.S. Application Data

(60) Provisional application No. 63/246,861, filed on Sep. 22, 2021.

(51) Int. Cl.

| | |
|---|---|
| ***H01J 37/32*** | (2006.01) |
| ***H10P 50/28*** | (2026.01) |
| ***H10P 72/76*** | (2026.01) |

(52) U.S. Cl.
CPC .. *H01J 37/32715* (2013.01); *H01J 37/32449* (2013.01); *H01J 37/32816* (2013.01);
(Continued)

(58) Field of Classification Search
None
See application file for complete search history.

(56) References Cited

U.S. PATENT DOCUMENTS 5,075,256 A 12/1991 Wang et al.
6,059,985 A 5/2000 Yoshimura et al.
(Continued)

FOREIGN PATENT DOCUMENTS

JP H0397869 A 4/1991
JP H09283459 A 10/1997
(Continued)

OTHER PUBLICATIONS

International Search Report and Written Opinion of the ISA issued in PCT/US2022/043635, mailed Jan. 2, 2023; ISA/KR.
(Continued)

*Primary Examiner* — Roberts P Culbert

(57) ABSTRACT

A method for processing a substrate loading the substrate onto a plurality of lift pins passing through a pedestal arranged in a processing chamber. The plurality of lift pins are lowered to rest the substrate on the pedestal. A deposition gas mixture is supplied to deposit film on the substrate. The supply of the deposition gas mixture is stopped. The substrate is raised above the pedestal in the processing chamber using the plurality of lift pins. An etch gas mixture is supplied. Plasma is struck in the processing chamber between the substrate and the surface of the pedestal to remove residual film.

14 Claims, 4 Drawing Sheets

(52) U.S. Cl.
CPC ........ *H10P 50/283* (2026.01); *H10P 72/7612* (2026.01); *H01J 2237/182* (2013.01); *H01J 2237/20235* (2013.01); *H01J 2237/334* (2013.01)

(56) References Cited

U.S. PATENT DOCUMENTS

| | | | | |
|---|---|---|---|---|
| 2007/0049042 | A1 | 3/2007 | Chen et al. | |
| 2007/0160507 | A1* | 7/2007 | Satoh | C23C 16/4586 422/135 |
| 2010/0218785 | A1 | 9/2010 | Green et al. | |
| 2016/0240385 | A1 | 8/2016 | Citla et al. | |
| 2018/0023193 | A1 | 1/2018 | Baluja et al. | |

FOREIGN PATENT DOCUMENTS

| | | | |
|---|---|---|---|
| JP | 2004281528 | A | 10/2004 |
| JP | 2008227466 | A | 9/2008 |
| JP | 2012238846 | A | 12/2012 |
| JP | 2013232670 | A | 11/2013 |
| KR | 101272024 | B1 | 6/2013 |
| TW | 201519314 | A | 5/2015 |
| WO | WO-2009070006 | A1 | 6/2009 |

OTHER PUBLICATIONS

Taiwanese Office Action for Taiwanese Application No. 111135640 dated Feb. 8, 2026.

Japanese Office Action and Search Report for Japanese Application No. 2024-518103 drafted May 15, 2026.

* cited by examiner

IN-SITU BACK SIDE PLASMA TREATMENT FOR RESIDUE REMOVAL FROM SUBSTRATES

CROSS-REFERENCE TO RELATED APPLICATIONS

This application is a U.S. National Phase Application under 35 U.S.C. 371 of International Application No. PCT/US2022/043635, filed on Sep. 15, 2022, which claims the benefit of U.S. Provisional Application No. 63/246,861, filed on Sep. 22, 2021. The entire disclosures of the applications referenced above are incorporated herein by reference.

FIELD

The present disclosure relates to substrate processing systems and more particularly to removal of back side residue insitu after deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition, etching and/or other treatment of substrates such as semiconductor wafers. A substrate may be arranged on a pedestal in a processing chamber. During deposition, a gas mixture including one or more precursors is introduced into the processing chamber. Plasma may be struck to deposit film on the substrate.

During deposition of film on a front side of the substrate, unintended deposition of the film may also occur on the back side of the substrate. For example, unwanted deposition of film may occur on a back side edge of the substrate and in a lift pin area. Unwanted deposition may also occur on the back side of the substrate corresponding to the minimum contact areas (MCAs) and/or in areas between the MCAs. For example, unwanted deposition occurs during deposition of carbon-based film using plasma-enhanced chemical vapor deposition (PECVD) in hard mask and carbon plug/liner applications.

Various approaches have been used to remove the residue. A pedestal with a seal band can potentially reduce deposition on the back side edge of the substrate. However, pedestals with seal bands are prone to arcing and do not resolve back side deposition at the MCAs, between the MCAs and in the lift pin area.

Pedestals with a purge focus ring have also been used. The purge focus ring directs an inert gas (such as molecular nitrogen ($N_2$)) toward the edge of the substrate from a location radially outside of the pedestal. This approach has not generally been implemented and adds significant cost.

Since MCA area deposition only happens on one side of a D electrode, monopolar clamping can also be used eliminate deposition on the other side. However, monopolar clamping has arcing concerns and does not resolve back side edge deposition.

To remove the back side deposition, additional integration steps such as bevel removal and/or back side treatment in another chamber are typically required. These additional steps increased the complexity of the integration process, require additional substrate handling and processing time, and increase cost.

SUMMARY

A method for processing a substrate comprises loading the substrate onto a plurality of lift pins passing through a pedestal arranged in a processing chamber; lowering the plurality of lift pins to rest the substrate on the pedestal; supplying a deposition gas mixture to deposit film on the substrate; stopping the supply of the deposition gas mixture; raising the substrate above the pedestal in the processing chamber using the plurality of lift pins; supplying an etch gas mixture; and striking plasma in the processing chamber between the substrate and the surface of the pedestal to perform etching to remove residual film.

In other features, the method includes striking plasma during deposition. The method includes setting RF power to a first RF power value during the deposition. The method includes setting RF power to a second RF power value during the etching, wherein the second RF power value is different than the first RF power value.

In other features, the method includes setting pressure in the processing chamber to a first pressure value during the deposition; and setting pressure in the processing chamber to a second pressure value during the etching, wherein the second pressure value is different than the first pressure value.

In other features, the method includes the plurality of lift pins are raised to a first height during loading of the substrate; and the plurality of lift pins are raised to a second height during the etching. The first height and the second height are the same.

In other features, the substrate includes a back side facing the pedestal and a front side facing a bottom surface of a showerhead. A gap is defined between the front side of the substrate and the bottom surface of the showerhead that is less than or equal to 2 mm when the plurality of lift pins are at the second height.

In other features, the method includes configuring a gas delivery system to supply the deposition gas mixture using a showerhead during the deposition and the etch gas mixture using the showerhead during the etching. The method includes configuring a gas delivery system to supply the deposition gas mixture using a showerhead during the deposition and a purge gas using the showerhead during the etching.

In other features, the method includes configuring the gas delivery system to supply the etch gas mixture using a side gas injector during the etching.

In other features, the film comprises an ashable hard mask. In other features, the etch gas mixture comprises one or more gases selected from a group consisting of molecular nitrogen ($N_2$), helium (He), nitrous oxide ($N_2O$), carbon dioxide ($CO_2$), hydrogen fluoride (HF), and molecular hydrogen ($H_2$).

A substrate processing system for depositing film on a substrate and performing etching of the substrate in situ includes a processing chamber including a pedestal and a plurality of lift pins passing through the pedestal. A plasma generator configured to selectively strike plasma in the processing chamber. A gas delivery system configured to supply a deposition gas mixture to deposit film on the substrate and, after deposition, to supply an etch gas mixture during etching to remove residual film. An actuator is configured to raise the plurality of lift pins for loading, lower the plurality of lift pins to rest the substrate on the pedestal during the deposition, and raise the plurality of lift pins after the etching. The plasma generator is configured to strike plasma between the substrate and the pedestal during the etching.

In other features, the gas delivery system comprises a showerhead. The plasma generator is configured to strike plasma between the substrate and the showerhead during the deposition. The plasma generator is configured to supply RF power at a first predetermined RF power during the deposition, and supply RF power at a second predetermined RF power during the etching. The second predetermined RF power is different than the first predetermined RF power.

In other features, pressure in the processing chamber is set to a first predetermined pressure during the deposition and is set to a second predetermined pressure during the etching, wherein the second predetermined pressure is different than the first predetermined pressure.

The actuator is configured to raise the plurality of lift pins to a first height during loading of the substrate and to a second height during the etching.

In other features, the first height and the second height are the same. When the plurality of lift pins are at the second height, a predetermined gap is defined between the substrate and a bottom surface of a showerhead that is less than or equal to 2 mm.

The gas delivery system is configured to supply the deposition gas mixture using a showerhead during the deposition and the etch gas mixture using the showerhead during the etching. The gas delivery system is configured to supply the deposition gas mixture using a showerhead during the deposition and a purge gas using the showerhead during the etching. The gas delivery system is configured to supply the etch gas mixture using a side gas injector during the etching.

In other features, the film comprises an ashable hard mask. The etch gas mixture comprises one or more gases selected from a group consisting of molecular nitrogen ($N_2$), helium (He), nitrous oxide ($N_2O$), carbon dioxide ($CO_2$), hydrogen fluoride (HF), and molecular hydrogen ($H_2$).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
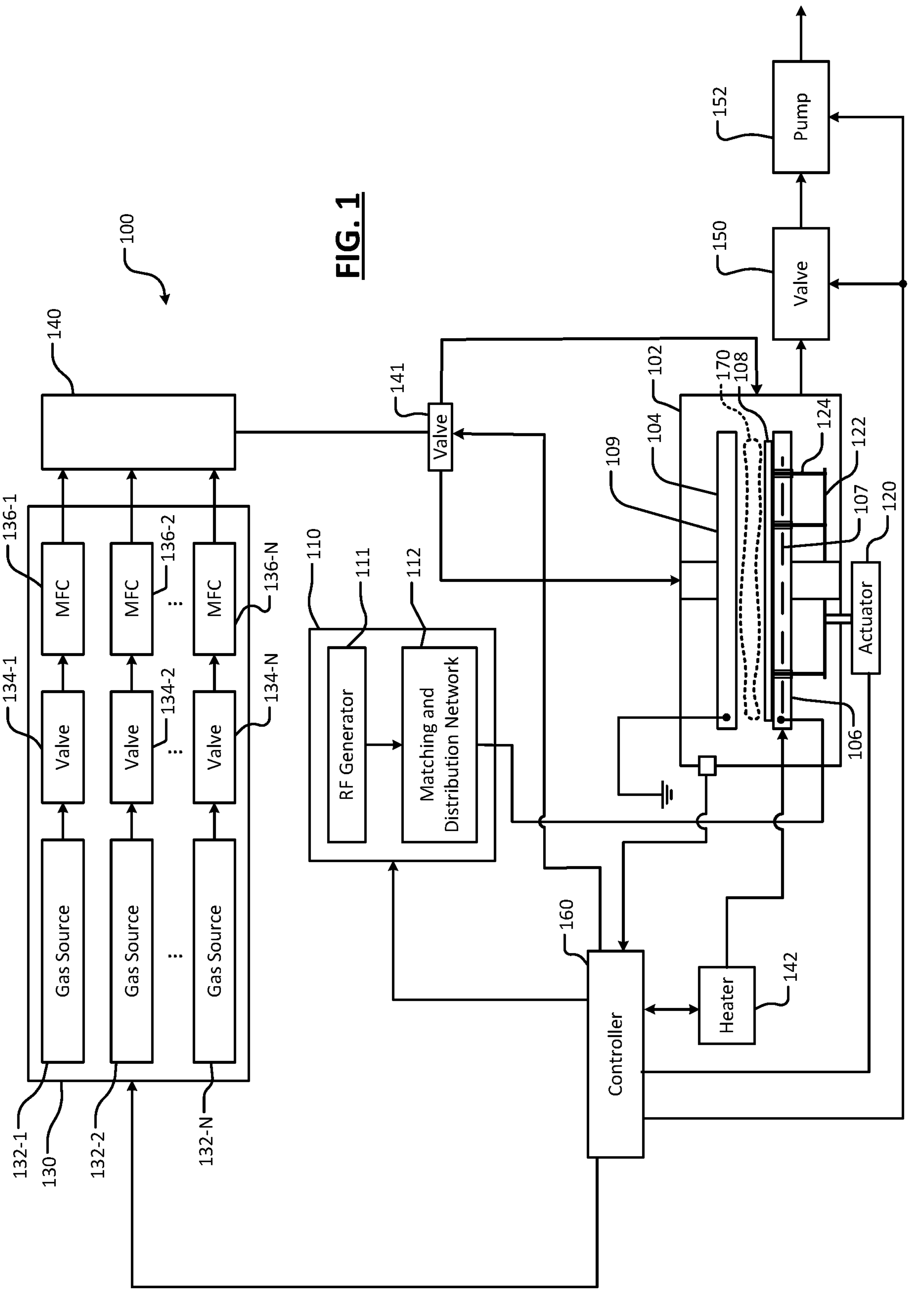
FIG. 1 is a functional block diagram of an example of a substrate processing system for depositing film on a substrate according to the present disclosure.

Systems and methods according to the present disclosure are used to remove residual film on a back side of a substrate insitu after deposition of film on a front side of the substrate. During deposition, the substrate rests on the pedestal and plasma may be struck between a gas delivery device such as a showerhead and a front side of the substrate.

After deposition, the substrate is raised on lift pins that are used to load and unload the substrate from the chamber. A predetermined gap is created between a back side of the substrate and the pedestal. Etch gas is supplied to the processing chamber and plasma is struck between the back side of the substrate and the pedestal. In some examples, the etch gas mixture is supplied using the showerhead. In other examples, the etch gas mixture is supplied from another location such as one or more side gas injectors. In still other examples, the etch gas mixture is supplied from the one or more side gas injectors and purge gas is supplied by the showerhead during etching.

For example, the processing chamber may be used to deposit a carbon-based ashable hard mask (AHM). After deposition, the substrate is raised on the lift pins and etching of the back side residual film is performed insitu. In some examples, little or no plasma is formed between the front side of the substrate and the showerhead due to the relatively small size of the predetermined gap defined therebetween.

The etch gas mixture that is used will vary based upon the type of film that is deposited onto the substrate during the preceding step. In some examples, a hard mask is deposited and the etch gas that is supplied during removal of the back side residual film includes one or more gases selected from a group consisting of molecular nitrogen ($N_2$), helium (He), nitrous oxide ($N_2O$), carbon dioxide ($CO_2$), hydrogen fluoride (HF) and/or molecular hydrogen ($H_2$), although other gases and/or gas mixtures can be used.

Since the amount of deposition on the back side of the substrate is relatively small, only a very short treatment period is required, which reduces the impact on the film located front side of the substrate. The removal of back side deposition as described herein solves a significant issue for carbon-based masks such as ashable hard masks (AHMs) with no additional hardware cost.

In other examples, after deposition of a carbon-based hard mask, the lift pins are raised to predetermined position, and an etch gas mixture such as $H_2$, $N_2O/N_2$ or $CO_2/He/N_2$ is introduced. The front side of the substrate is arranged very close to the showerhead and the back side is located in a spaced location relative to the pedestal. The pressure in the processing chamber and RF power are adjusted for the etch step and plasma is struck and maintained between the substrate and the pedestal for a predetermined period.

During etching, the residual film is removed from the back side of the substrate. In some examples, since the predetermined period is very short and plasma exposure on the front side is very limited, only a very small amount of film is removed from the front side edge of the substrate. However, this is not a problem for most processes. Under certain circumstances, this method can also be used to modulate a wafer edge profile on front side of the substrate.

In some examples, $CO_2$ is used during etching of the back side to provide a slightly milder treatment. In other examples, $N_2$ purge is supplied by the showerhead to protect the front side film on the substrate and $N_2O$ is supplied as the etch gas.

As can be appreciated, etching of the back side residual film in-situ causes minimal throughput loss. The back side residual film removal requires a short treatment with the substrate located in a lift pin-up position. If the lift pin-up position corresponds to the loading and unloading position, no additional substrate movement is needed prior to unloading the substrate. The systems and methods described herein reduce cost by eliminating multiple integration steps.

Figure 2:
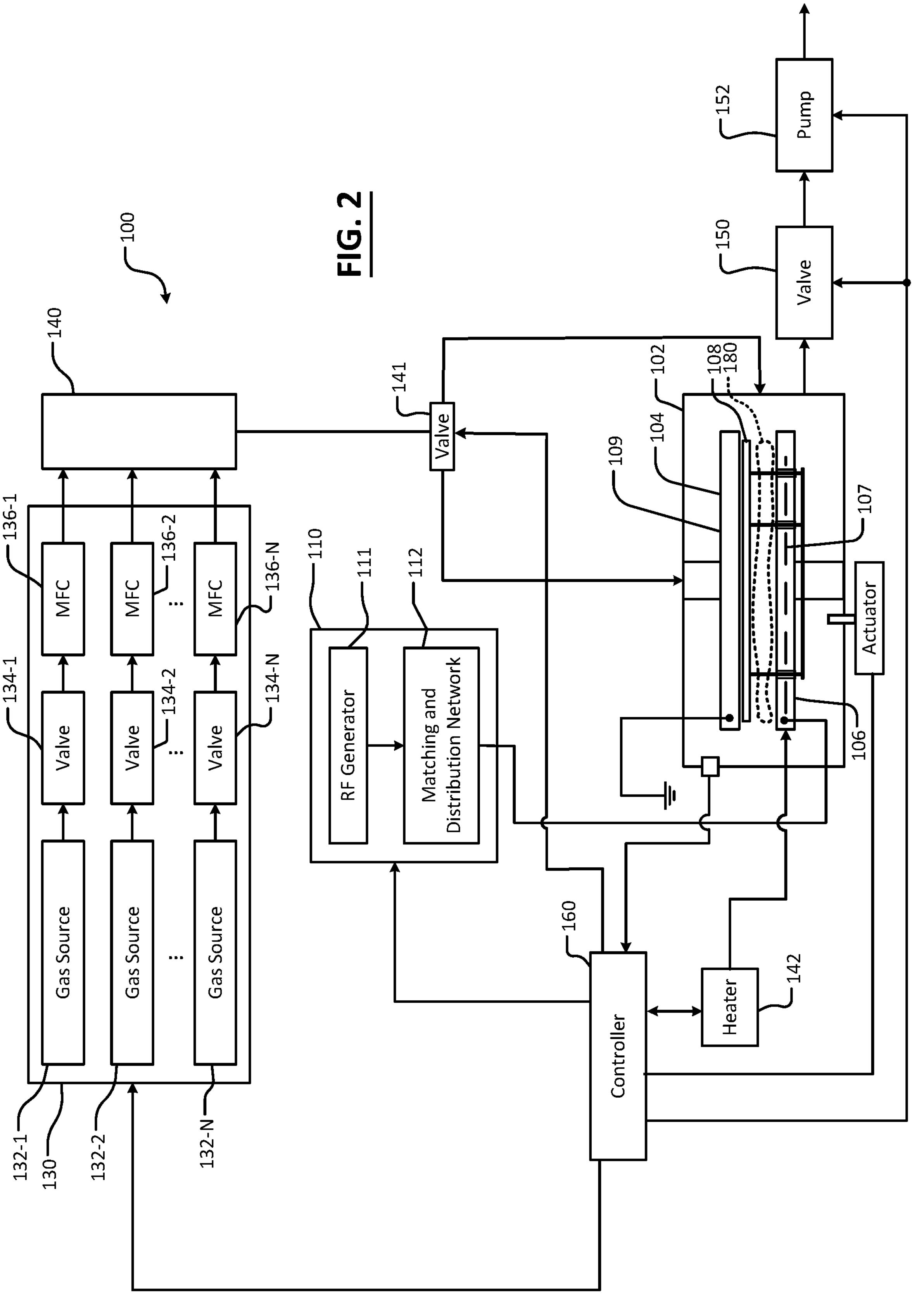
FIG. 2 is a functional block diagram of an example of the substrate processing system of FIG. 1 with the substrate raised by the lift pins during removal of residual film on a back side of the substrate according to the present disclosure.

Referring now to FIGS. 1 and 2, an example of a substrate processing system 100 for performing deposition followed by in situ plasma etching is shown. In the example described below, the substrate processing system may perform plasma-enhanced chemical vapor deposition (PECVD) followed by plasma etching. However, other types of deposition both with and without plasma may be performed and then the residual film can be removed by an insitu plasma etch step described further below.

In FIG. 1, the substrate processing system 100 includes a processing chamber 102 that encloses other components of the substrate processing system 100 and contains the RF plasma. The substrate processing system 100 includes an upper electrode 104 and a pedestal 106 including an embedded lower electrode 107. Alternately, the pedestal 106 may include a ceramic top layer bonded to a baseplate (and the baseplate acts as the lower electrode 107). During operation, a substrate 108 is arranged on the pedestal 106 between the upper electrode 104 and the lower electrode 107. In some examples, the pedestal 106 may include an electrostatic chuck (ESC) that includes electrodes that electrostatically attract the substrate during deposition.

For example, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

An RF generating system 110 generates and outputs RF power to one of the upper electrode 104 and the lower electrode 107. The other one of the upper electrode 104 and the lower electrode 107 may be DC grounded, AC grounded or floating. For example, the RF generating system 110 may include an RF generator 111 that generates the RF power that is fed by a matching and distribution network 112 to the lower electrode 107 and the upper electrode 104 is grounded.

An actuator 120 and a lift pin assembly 122 including P lift pins (where P is an integer greater than 2) are used during loading and unloading of the substrate from the chamber. The actuator 120 and the lift pin assembly 122 lower the substrate into a deposition position with the substrate resting on the pedestal 106. After deposition is complete, the actuator 120 and the lift pin assembly 122 raise the substrate to an etch position with the front side of the substrate located within a predetermined gap of the showerhead 109. Plasma is struck between the back side of the substrate and the pedestal 106 to etch the residual film on the back side of the substrate. The size of the predetermined gap is selected to be small to substantially reduce or eliminate plasma between the front side of the substrate and the showerhead.

In some examples, the raised position of the lift pins during etching of the back side is the same as the raised position of the lift pins during loading and unloading. In other examples, the raised position of the lift pins during etching of the back side is different than the raised position of the lift pins during loading and unloading. In some examples, the raised position of the lift pins places the front side surface within a predetermined gap or distance from the showerhead. In some examples, the predetermined gap is less than or equal to 2 mm, 1 mm or 0.5 mm, although other values may be used.

A gas delivery system 130 includes one or more gas sources 132-1, 132-2, . . . , and 132-N (collectively gas sources 132), where N is an integer greater than zero. The gas sources 132 supply one or more process gases such as deposition precursors, purge gas, etch gas, etc. In some examples, vaporized precursors may also be used (not shown). The gas sources 132 are connected by valves 134-1, 134-2, . . . , and 134-N (collectively valves 134), mass flow controllers 136-1, 136-2, . . . , and 136-N (collectively mass flow controllers 136), and valves 138-1, 138-2, . . . , and 138-N (collectively valves 138) to a manifold 140. An output of the manifold 140 is fed by the gas delivery system 130 to the processing chamber 102. For example, the output of the manifold 140 is fed to the showerhead 109.

In some examples, the etch gas is delivered through the showerhead 109. In other examples, a valve 141 may be used to flow the etch gas mixture to a side gas injector location(s) during etching of the residual film on the back side. In some examples, the gas delivery system 130 may further include a purge gas source 143 to supply purge gas via a valve 145 to the showerhead 109 and onto the front facing side of the substrate when the etch gas mixture is supplied from the side gas location to reduce etching of the front side of the substrate.

A heater 142 may be connected to a heater coil (not shown) arranged in the pedestal 106. The heater 142 may be used to control a temperature of the pedestal 106 and the substrate 108. In addition, the pedestal 106 may include internal channels (not shown) to flow a fluid from a fluid source (not shown) to provide further control of the pedestal and substrate temperatures. A valve 150 and pump 152 may be used to evacuate reactants from the processing chamber 102 and/or to control pressure in the processing chamber. A controller 160 may be used to control the various components of the substrate processing system 100 described herein.

After loading of the substrate 108 onto the lift pins 124, the actuator 120 and lift pin assembly 122 lower the substrate 108 onto the pedestal. 106. Pressure in the processing chamber is adjusted to a desired deposition pressure, a deposition gas mixture is supplied and plasma 170 is struck. The RF power and chamber pressure are optimized depending upon the type of film to be deposited. Film is deposited onto an exposed surface of the substrate during the deposition period. Some residual film is deposited on a back side of the substrate. After deposition is complete, flow of the deposition gas mixture is stopped, plasma is extinguished and the reactants are evacuated.

The pressure in the processing chamber is optionally adjusted to a desired etch pressure. The actuator 120 and the lift pin assembly 122 raise the substrate 108 as shown in FIG. 2. The etch gas mixture is supplied and plasma 180 is struck for a predetermined etch period. In some examples, the RF power is adjusted for etching. In some examples, the predetermined etch period is less than 5 s, 4 s, 3 s, 2 s, or 1 s. The predetermined etch period will be determined based on the thickness of the residual film deposited on the back side, sensitivity of the front side to the etch process, the type of film to be etched, and the etch chemistry that is used.

Figure 3:
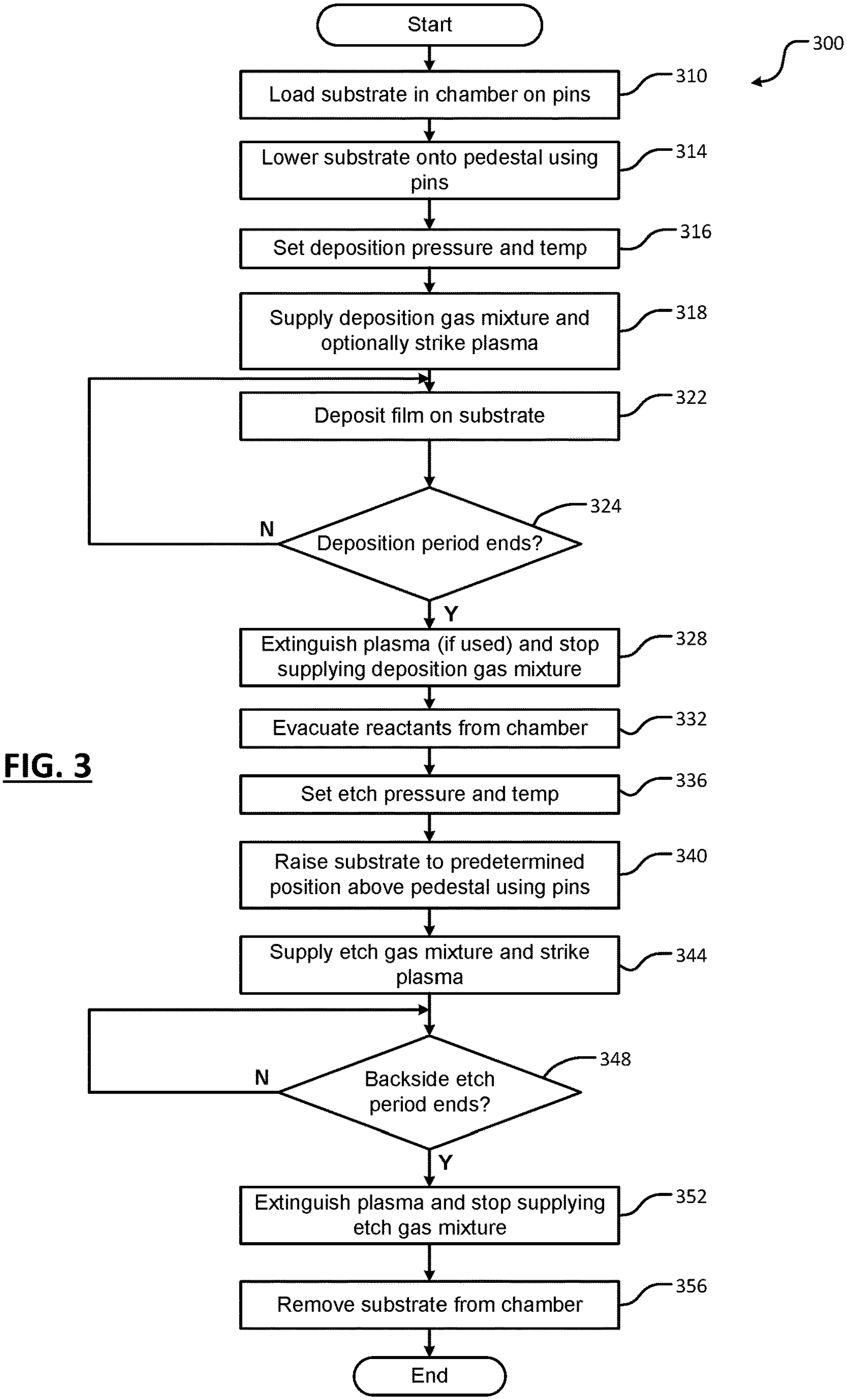
FIG. 3 is a flowchart of an example of a method for removing back side deposition in situ according to the present disclosure.

Referring now to FIG. 3, a method 300 for processing a substrate is shown. At 310, the substrate is loaded into the processing chamber and onto the lift pins. At 314, the substrate is lowered onto the pedestal using the lift pins. At 316, deposition conditions such as RF power, chamber pressure and/or pedestal temperature are set to predetermined values. At 318, a deposition gas mixture is supplied and plasma is struck (if used). At 322, film is deposited onto the substrate during a deposition period. At 324, the method determines whether the deposition period has ended. If 324 is false, the method continues at 322. If 324 is true, the method continues at 328 and the plasma is extinguished (if used) and flow of the deposition gas mixture is stopped. At 332, reactants are evacuated from the processing chamber.

At this point, the processing chamber is reconfigured to perform etching of the back side of the substrate insitu (without moving the substrate to another chamber). At 336, etch pressure and RF power are optionally adjusted. At 340, the substrate is raised to a predetermined position above the pedestal using the lift pins. As can be appreciated, the steps 336 and 340 (as well as other steps described herein) can be performed in another order. At 344, the etch gas mixture is supplied and plasma is struck.

At 348, the method determines when the back side etch period is up. When 348 is true, the plasma is extinguished and flow of the etch gas mixture is stopped at 352. At 356, the substrate is removed from the processing chamber.

Figure 4B:
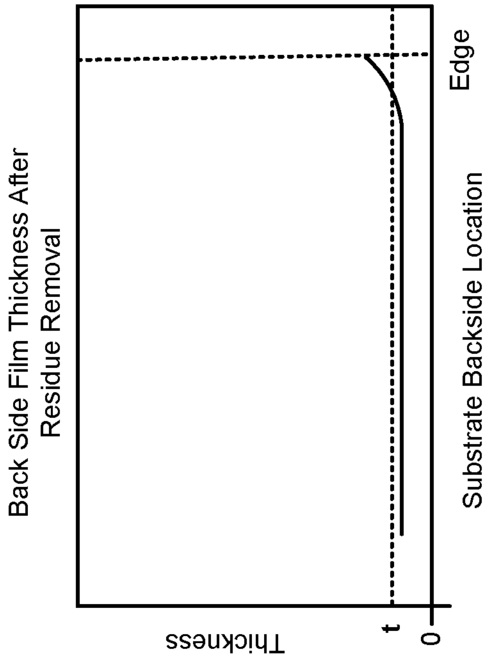
FIG. 4B illustrates an example of a thickness of film on a back side of the substrate after removal.
Figure 4A:
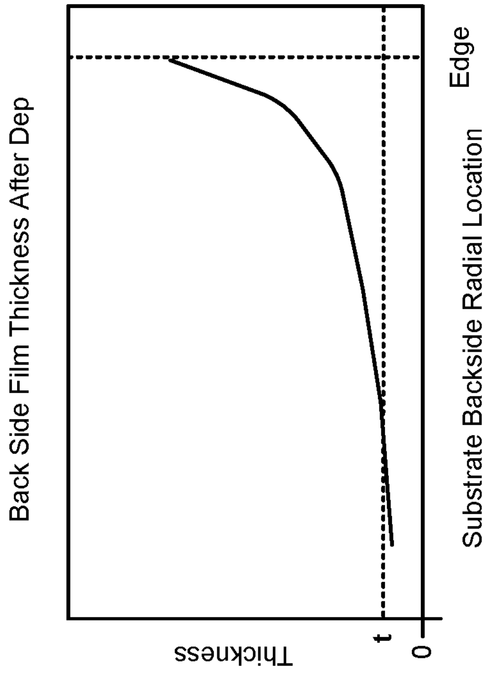
FIG. 4A illustrates an example of a thickness of film on a back side of the substrate before removal.

Referring now to FIGS. 4A and 4B, back side film thickness is shown. In FIG. 4A, back side film thickness is shown after deposition and before residue removal. The thickness of the back side film increases towards an outer radial edge of the substrate. In FIG. 4B, the substrate is shown after residue removal as described herein. The thickness of the residue on the back side substantially reduced (e.g. below a desired thickness t) with minimal removal of film on the front side.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the processing chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a substrate, comprising:

loading the substrate onto a plurality of lift pins passing through a pedestal arranged in a processing chamber;

lowering the plurality of lift pins to rest the substrate on the pedestal;

supplying a deposition gas mixture to deposit film on the substrate;

stopping the supply of the deposition gas mixture;

raising the substrate above the pedestal in the processing chamber using the plurality of lift pins;

supplying an etch gas mixture; and striking plasma in the processing chamber between the substrate and the surface of the pedestal to perform etching to remove residual film.

2. The method of claim 1, further comprising striking plasma during the deposition.

3. The method of claim 2, further comprising:

setting RF power to a first RF power value during the deposition; and setting RF power to a second RF power value during the etching, wherein the second RF power value is different than the first RF power value.

4. The method of claim 1, further comprising:

setting pressure in the processing chamber to a first pressure value during the deposition; and setting pressure in the processing chamber to a second pressure value during the etching, wherein the second pressure value is different than the first pressure value.

5. The method of claim 1, wherein:

the plurality of lift pins are raised to a first height during loading of the substrate; and the plurality of lift pins are raised to a second height during etching.

6. The method of claim 5, wherein the first height and the second height are the same.

7. The method of claim 5, wherein the substrate includes a back side facing the pedestal and a front side facing a bottom surface of a showerhead, and wherein a gap is defined between the front side of the substrate and the bottom surface of the showerhead that is less than or equal to 2 mm when the plurality of lift pins are at the second height.

8. The method of claim 1, further comprising configuring a gas delivery system to supply the deposition gas mixture using a showerhead during the deposition and the etch gas mixture using the showerhead during the etching.

9. The method of claim 1, further comprising configuring a gas delivery system to supply the deposition gas mixture using a showerhead during the deposition and a purge gas using the showerhead during the etching.

10. The method of claim 9, further comprising configuring the gas delivery system to supply the etch gas mixture using a side gas injector during the etching.

11. The method of claim 1, wherein:

the film comprises an ashable hard mask; and the etch gas mixture comprises one or more gases selected from a group consisting of molecular nitrogen ($N_2$), helium (He), nitrous oxide ($N_2O$), carbon dioxide ($CO_2$), hydrogen fluoride (HF), and molecular hydrogen ($H_2$).

12. The method of claim 1, further comprising setting pressure in the processing chamber to modulate edge profile on a front side of the substrate that faces a bottom surface of a showerhead during the etching.

13. The method of claim 1, further comprising raising the substrate adjacent to a showerhead in the processing chamber during the etching.

14. The method of claim 1, further comprising striking plasma by applying power to a showerhead or the pedestal in the processing chamber.

* * * * *